(12) United States Patent
Naruse et al.

(10) Patent No.: US 7,273,810 B2
(45) Date of Patent: Sep. 25, 2007

(54) SEMICONDUCTOR APPARATUS AND METHOD OF FABRICATING THE SAME

(75) Inventors: Yohko Naruse, Ichinomiya (JP); Naoteru Matsubara, Gifu (JP); Kazunori Fujita, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 357 days.

(21) Appl. No.: 10/950,689

(22) Filed: Sep. 28, 2004

(65) Prior Publication Data

US 2005/0093156 A1 May 5, 2005

(30) Foreign Application Priority Data

Sep. 30, 2003 (JP) ............................. 2003-341597
Sep. 7, 2004 (JP) ............................. 2004-259357

(51) Int. Cl.
*H01L 21/44* (2006.01)
*H01L 29/40* (2006.01)

(52) U.S. Cl. ...................................... 438/653; 257/621

(58) Field of Classification Search ................ 438/653, 438/675, 151, 158; 257/276, 330, 621, 626
See application file for complete search history.

(56) References Cited

U.S. PATENT DOCUMENTS 6,972,253 B2 * 12/2005 Liu et al. .................... 438/627
7,071,515 B2 * 7/2006 Sheu et al. .................. 257/374

FOREIGN PATENT DOCUMENTS

JP     2002-246391     8/2002

OTHER PUBLICATIONS

"Dependence of TDDB Characteristic of Cu Interconnect in Wiring Structure"; pp. 2-42-2-245 (unknown year).
"Dependence of TDDB Characteristic of Cu Interconnect on Wiring Structure" (unknown year).

* cited by examiner

*Primary Examiner*—Calvin Lee
(74) *Attorney, Agent, or Firm*—McDermott Will & Emery LLP

(57) ABSTRACT

A semiconductor apparatus is constructed such that the top surface, contacting a barrier metal film, of a conducting film embedded in a trench is located below the top surface of a second interlayer insulating film. The semiconductor apparatus is fabricated such that a plasma treatment is performed in a non-nitriding environment after a polishing process using CMP, so as to form a damaged layer on top of the second interlayer insulating film and the conducting film, and a portion of the damaged layer is removed by etching.

10 Claims, 9 Drawing Sheets

△, ▲ AMMONIA SOLUTION CLEANING+ORGANIC ACID CLEANING+HF CLEANING
□, ■ AMMONIA SOLUTION CLEANING+PLASMA TREATMENT+ORGANIC ACID CLEANING+HF CLEANING
* AMMONIA SOLUTION CLEANING

SEMICONDUCTOR APPARATUS AND METHOD OF FABRICATING THE SAME

BACKGROUND OF THE INVENTION

1. Field of the Invention

The present invention generally relates to a semiconductor apparatus and a method of fabricating the same and, more particularly, to a semiconductor apparatus in which a conducting film made of copper is used as a embedded wiring.

2. Description of the Related Art

It is well known that wiring delay in a semiconductor integrated circuit exercises significant effects as the design rule to fabricate a semiconductor integrated circuit becomes increasingly finer in recent years. The wiring delay is referred to as RC delay. By reducing a product of wiring resistance (R) and wiring capacity (C), the length of delay is controlled.

In the related art exemplified by a patent document No. 1, there is proposed, for control of the delay, a semiconductor apparatus in which copper (Cu), characterized by low resistance than aluminum (Al), is used to form wiring and in which a material of a dielectric constant (low-k material) lower than that of silicon oxide (dielectric constant≈4) is used to form an interlayer insulating film. A semiconductor of this type is usually fabricated using the well-known single damascene method or the dual damascene method.

A description will now be given of a structure of related-art semiconductor apparatus by referring to FIG. 14.

As shown in FIG. 14, a semiconductor apparatus comprises a stack of a substrate (not shown) formed of silicon or the like, an insulating film 21 formed on the substrate, a first interlayer insulating film 22 formed of silicon nitride (SiN) or the like, and a second interlayer insulating film 23 formed of a low-k material such as methyl silsesquioxane (MSQ). A connecting hole 21a is formed in the insulating film 21. A connecting hole wiring 21b formed of copper or the like is provided in the connecting hole 21a.

A trench 23a extending to the connecting hole wiring 21b is formed in the first interlayer insulating film 22 and the second interlayer insulating film 23 by forming a desired pattern by, for example, photolithography and subsequent dry etching. A barrier metal film 24 formed of, for example, tantalum is formed on the interior wall of the trench 23a by, for example, sputtering. A seed layer (not shown) of copper is formed inside the trench 23a. Thereafter, a copper film 25 is embedded by metal plating. The surface of the second interlayer insulating film 23 and the copper film 25 is flattened by chemical mechanical polishing (CMP).

In building a multilayer wiring using the semiconductor apparatus, a third interlayer insulating film of silicon nitride or the like is formed on the second interlayer insulating film 23 and the copper film 25, using plasma chemical vapor deposition (CVD) in order to suppress upward diffusion of copper. In addition, a fourth interlayer insulating film of a low-k material such as MSQ is formed on the third interlayer insulating film as an upper interlayer insulating film. A desired pattern is formed on the fourth interlayer insulating film by, for example, photolithography. Subsequently, the film is dry-etched to create a connecting hole connecting the lower layer wiring and the upper layer wiring. Inside the connecting hole is embedded a metal such as copper or tungsten (W) so as to form an interlayer connecting plug for electrically connecting the lower layer wiring with the upper layer wiring.

Related Art List

Japanese Laid-Open Utility Model Application No. 2002-246391

One problem with the semiconductor apparatus using copper as a wiring material is that copper has a significantly shorter time dependent dielectric breakdown (TDDB) lifetime compared to aluminum (Al) and tungsten (W). Another problem is that a low-k insulating material generally has a low dielectric breakdown strength. For this reason, dielectric breakdown easily occurs between adjacent wirings if a low-k material is used in place of silicon oxide. This will increase the likelihood of the TDDB lifetime becoming shorter.

In order to minimize a drop in the TDDB lifetime, the semiconductor apparatus described, for example, in the patent document No. 1 is fabricated such that, subsequent to the flattening process using CMP, the surface of the copper film 25 is cleaned and subject to a plasma treatment using nitrogen and ammonia as a source gas. More specifically, a copper nitride (CuN) layer is formed on the surface of the copper film 25 as a result of the plasma treatment. When an insulating film containing silicon, such as the film of silicon nitride, is formed on the second interlayer insulating film and the copper film 25 as a third interlayer insulating film, the CuN layer mentioned above suppresses diffusion of silicon from the insulating film to the copper film 25. Since the surface of the copper film 25 is cleaned by a cleaning process mentioned above, a thin copper silicide layer of an even thickness is formed in the neighborhood of the surface of the copper film 25. By forming the CuN layer capable of properly suppressing diffusion of silicon and forming a copper silicide layer of an even thickness in the neighborhood of the surface of the copper film 25, it is intended that a drop the TDDB lifetime be improved.

We have found that, in building a multilayer wiring using the semiconductor apparatus according to the fabrication method as described above, resist poisoning, caused by a plasma treatment using nitrogen and ammonia as a source gas, occurs when forming a pattern on the fourth interlayer insulating film.

A detailed description will now be given of resist poisoning, by referring to FIG. 15. FIG. 15 is an enlarged schematic section showing a process for building a multilayer wiring using a semiconductor apparatus shown in FIG. 14. More specifically, a third interlayer insulating film 32 and a fourth interlayer insulating film 33 are successively built on the second interlayer insulating film 23. A resist Re is applied on top of the fourth interlayer insulating film 33 so that a desired pattern is formed in the fourth interlayer insulating film 33 by photolithography.

By performing a plasma treatment in a gaseous environment containing nitrogen atoms, a damaged layer DL containing nitrogen atoms ND is formed on the surface of the second interlayer insulating film 23, as shown in FIG. 15. The damaged layer DL remains after the cleaning. The nitrogen atoms ND remain contained in the damaged layer DL in an unstable and weak-binding state or in an non-binding state. Nitrogen atoms, even in a small quantity, causes resist poisoning Re by being detached from the damaged layer DL in the process of heating (pre-baking) the resist before exposure, and by encroaching the resist Re. When resist poisoning occurs, it becomes impossible to obtain a proper pattern of the fourth interlayer insulating film 33. This may cause disconnection etc.

As described above, it is inevitable that the reliability of wiring suffers in the related-art semiconductor apparatus.

The present invention has been done in view of the above-mentioned circumstances and its object is to provide a semiconductor apparatus in which the reliability of wiring is improved even when multilayer wiring, using copper or copper alloys as a conducting film for forming a wiring layer, is employed, and a method of fabricating the apparatus.

SUMMARY OF THE INVENTION

A description of means to achieve the object and their operation and effect will now be given.

A semiconductor apparatus according to a first aspect of the invention comprises: an insulating film provided with a trench; a barrier metal film formed on the interior wall of the trench; and a conducting film formed so as to be embedded in the trench interior to the barrier metal film, wherein at least the top surface of the conducting film contacting the barrier metal film is located below the upper end of the barrier metal film.

Normally, in a semiconductor apparatus provided with an embedded wiring, a barrier metal film for suppressing diffusion from the embedded wiring, and an insulating film for providing insulation between wirings, an electric field generated when a voltage is applied between wirings is concentrated on the top surface of the wiring. As a result, wiring material is diffused from the top surface of wiring, and a leak path, in which a current is easy to flow, is formed through the barrier metal film and the top surface of the insulating film. Dielectric breakdown between adjacent wirings mentioned above is primarily caused by formation of a leak path. In accordance with the aforementioned structure of the invention, the top surface of the conducting film, embedded wiring, is kept away from the top surface of the barrier metal film, thereby ensuring that a leak path is substantially long. With this, formation of a leak path caused by diffusion from the conducting film is suppressed or prevented. This translates into suppression of dielectric breakdown between adjacent wirings.

According to a second aspect of the invention, at least the top surface of the conducting film contacting the barrier metal film is located below the top surface of the insulating film.

In accordance with the aforementioned semiconductor apparatus structure of the invention, the top surface of the conducting film (wiring) is kept away from the top surface of the insulating film so that formation of a leak path caused by diffusion from the conducting film is suppressed or prevented even when the diffusion from the conducting film penetrates the barrier film. As a result, dielectric breakdown between adjacent wirings is properly suppressed.

According to a third aspect of the invention, at least the top surface of the conducting film contacting the barrier metal film is located below the upper end of the barrier metal film.

In accordance with the aforementioned semiconductor apparatus structure of the invention, the top surface of the barrier metal film is kept away from the top surface of the insulating film so that it is ensured that a leak path is substantially long, and dielectric breakdown between adjacent wirings is properly suppressed.

According to a fourth aspect of the invention, the top surface of the conducting film is configured to have an arc-shaped cross section that sinks toward a point of contact with the barrier metal film.

Since the concentration of electric field occurs at the edges of the top surface of the conducting film (wiring) contacting the barrier metal film, concentration of electric field is mitigated by configuring the top surface of the conducting film to have an arc-shaped cross section. Accordingly, dielectric breakdown strength between adjacent wirings is further improved.

According to a fifth aspect of the invention, composition of a top portion of the insulating film is altered.

An insulating film with a high resistance to etching can have its resistance to etching lowered by altering the composition and reducing the bonding strength. In accordance with the aforementioned structure, by etching a top portion of the insulating film in which the composition is altered, contaminants collected on top of the insulating film and composed of a conducting film (wiring) material and a barrier metal film material are properly removed. Accordingly, dielectric breakdown strength between adjacent wirings is further improved.

According to a sixth aspect of the invention, the insulating film is formed of a low-k material with a dielectric constant lower than that of silicon oxide. In accordance with this aspect of the invention, dielectric breakdown between adjacent wirings is suppressed and wiring delay is suppressed. According to a seventh aspect of the invention, examples of Low-k materials are silicon oxide containing methyl groups, benzocyclobutene (BCB), fluorinated silicon dioxide (SiOF), hydrogen silsesquioxane (HSQ), methyl silsesquioxane (MSQ), hydride methyl silsesquioxane (HMSQ), polyimide polymer, allylene ether polymer, cyclobutene polymer, and perfluorinated cyclobutene (PFCB). According to an eighth aspect of the invention, the dielectric constant of a low-k material is 2.7-3. By using a low-k material, a drop in the TDB lifetime is minimized.

A semiconductor apparatus fabrication method according to a ninth aspect of the invention comprises the steps of:

(a) forming an insulating film;

(b) forming a trench in the insulating film;

(c) forming a barrier metal film in the interior wall of the trench;

(d) forming a conducting film on the barrier metal film so as to be embedded in the trench;

(e) removing the conducting film by polishing so as to expose the insulating film;

(f) forming a damaged layer on top of the exposed insulating film and the conducting film in a non-nitriding environment; and (g) removing at least a portion of the damaged layer by etching.

According to the fabrication method described above, the damaged layer not containing nitrogen atoms is formed on top of the second interlayer insulating film and the conducting film since the damaged layer is formed in a non-nitriding environment. Consequently, even when a resist is deposited on the damaged layer so as to form a upper layer wiring pattern and the resist is subject to a heating (pre-baking) process before exposure, the likelihood of nitrogen atoms being introduced into the resist is reduced. Accordingly, resist poisoning discussed above is suppressed by employing the semiconductor fabrication method as described above. By removing the damaged layer formed on top of the insulating film and the conducting film, contaminant or the like collected on the insulating film is properly removed. Further, by removing the top surface of the insulating film by selective etching and locating the insulating film below the upper end of the barrier metal film, dielectric breakdown between adjacent wirings is properly suppressed.

According to a tenth aspect of the invention, a low-k material with a dielectric constant lower than that of silicon oxide is used to form the insulating film.

According to an eleventh aspect of invention, the low-k material is selected from a group comprising: silicon oxide containing methyl groups, benzocyclobutene (BCB), fluorinated silicon dioxide (SiOF), hydrogen silsesquioxane (HSQ), methyl silsesquioxane (MSQ), hydride methyl silsesquioxane (HMSQ), polyimide polymer, allylene ether polymer, cyclobutene polymer, and perfluorinated cyclobutene (PFCB).

Silicon oxide containing metyl groups generally tends to transform into silicon oxide as a result of methyl groups being dissolved by damage. With this, selective etching of the damaged layer formed in the insulating film is properly performed.

The invention includes the following technical ideas.

(1) The semiconductor apparatus according to the first through eighth aspects of the invention in which the trench comprises a connecting hole and a groove having a section width larger than that of the connecting hole and located above the connecting hole.

Thus, the invention according to the first through eighth aspects is applicable to a structure in which the conducting film comprises a portion corresponding to wiring and an interlayer connecting plug for connecting the wiring portion and an underlying wiring.

(2) The semiconductor apparatus according to the first through eighth aspects of the invention and the invention of (1) in which the conducting film is formed of copper or copper alloy.

Diffusion of wiring material is particularly noticeable when the conducting film (wiring) is formed of copper or copper alloy. Accordingly, the invention according to the first through eighth aspects and the invention of (1) are particularly suitable when being applied to the semiconductor apparatus in which copper of copper alloy is used to form the insulating film.

(3) The semiconductor apparatus fabrication method according to the ninth through eleventh aspects of the invention, in which formation of a damaged layer is performed by a plasma treatment using noble gas.

(4) The semiconductor apparatus fabrication method according to the ninth aspect of the invention in which formation of a damaged layer is performed by irradiation of electronic beam or ultraviolet beam.

By forming a damaged layer by a plasma treatment using noble gas, or electronic beam or ultraviolet beam irradiation in the invention according to the ninth through eleventh aspects, a damaged layer is properly formed in a non-nitriding environment.

(5) The semiconductor apparatus fabrication method according to the ninth aspect of the invention in which etching of the damaged layer is performed using hydrofluoric acid (HF).

Using hydrofluoric acid to etch the damaged layer is particularly useful in the invention according to the ninth through eleventh aspects.

(6) The semiconductor apparatus fabrication method according to the ninth through eleventh aspects of the invention and the invention of (3)-(5), in which the step of forming the trench includes the steps of forming a connecting hole, and forming a groove having a section width larger than that of the connecting hole and located above the connecting hole.

Thus, the invention according to the ninth through eleventh aspects and the invention of (3)-(5) are suitably applied to a fabrication method generally referred to as the dual damascene method in which the step of forming the trench includes the steps of forming a groove in which a wiring is formed, and forming a connecting hole for connecting an upper-layer wiring and a lower-layer wiring.

(7) The semiconductor apparatus fabrication method according to the ninth through eleventh aspects and the invention of (3)-(6), in which copper or copper alloy is used to form the insulating film.

The semiconductor apparatus fabrication method according to the ninth through eleventh aspects of the invention and the invention of (3)-(6) are particularly suitable when copper or copper alloy is used to form the conducting film.

(8) The semiconductor apparatus fabrication method according to the invention of (7), in which the barrier metal film is formed of, for example, titanium (Ti), titanium nitride (TiN), tantalum (Ta), or tantalum nitride (TaN).

By using titanium (Ti), titanium nitride (TiN), tantalum (Ta), or tantalum nitride (TaN) as the barrier metal film in the semiconductor apparatus fabrication method according to the invention of (7), selective etching of the conducting film and the barrier metal film is easily performed.

According to the present invention, reliability of wiring in a semiconductor apparatus is improved.

DETAILED DESCRIPTION OF THE INVENTION

First Embodiment

Figure 1:
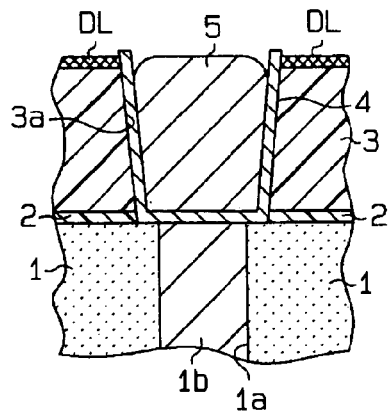
FIG. 1 is a schematic section showing a semiconductor apparatus according to a first embodiment of the present invention.

FIG. 1 shows a semiconductor apparatus according to a first embodiment of the present invention.

In a similar configuration as the related-art semiconductor apparatus described above, improvement in the TDDB, by suppressing dielectric breakdown occurring between adjacent wirings, is intended as the purpose in the semiconductor apparatus according to the first embodiment. In addition, the semiconductor apparatus according to the embodiment is adapted for suppression of resist poisoning by employing the structure shown in FIG. 1.

A description will now be given of the structure of the semiconductor apparatus according to the first embodiment by referring to FIG. 1. FIG. 1 shows a schematic section of the semiconductor apparatus according to the first embodiment.

As shown in FIG. 1, the semiconductor apparatus comprises a stack of: an insulating film 1 formed of silicon oxide or the like; a first interlayer insulating film 2 formed of SiCN or the like capable of effectively preventing diffusion of copper; and a second interlayer insulating film 3 formed, for example, by the CVD process and formed of a low-k material such as SiOC including methyl groups (relative dielectric constant k=2.0-3.0). The insulating film 1 is formed on a substrate (not shown) of silicon or the like in which elements such as transistors are formed. A connecting hole 1a is formed in the insulating film 1. Inside the connecting hole 1a is formed a connecting hole wiring 1b.

A trench 3a extending to the connecting hole wiring 1b is formed in the first interlayer insulating film 2 and the second interlayer insulating film 3. On the interior wall (lateral and bottom) of the trench 3a is formed a barrier metal film 4 formed of, for example, tantalum nitride (TaN). A conducting film 5 of copper is built on the barrier metal film 4 by being embedded in the trench 3a. The conducting film 5 is electrically connected to contact electrodes etc. of the transistors formed on the substrate via the connecting hole wiring 1b and the barrier metal film 4. The barrier metal film 4 provides the function of improving adhesion between the conducting film 5 and the interlayer insulating film or suppressing diffusion from the conducting film 5. The second interlayer insulating film 3 is formed with a thickness of, for example, 2500 Å-10000 Å, and the barrier metal film 4 is formed with a thickness of, for example, 250 Å. For example, the conducting film 5 is formed with a thickness of 3000 Å and a width of 0.18 µm.

The top surface of the conducting film 5 contacting the barrier metal film 4 is located below the top surface of the second interlayer insulating film 3. With this structure, the top surface of the conducting film 5, i.e. embedded wiring, is spatially kept away from the top surface of the barrier metal film 4, thereby ensuring that a leak path, in which a current is easy to flow, is substantially long. With this, formation of a leak path caused by diffusion from the conducting film 5 is suppressed or prevented. This translates into suppression of dielectric breakdown between adjacent wirings. Even when diffusion from the conducting film 5 occurs across the barrier metal film 4, formation of a leak path caused by diffusion from the conducting film 5 is suppressed or prevented because the top surface of the conducting film 5 is also spatially kept away from the top surface of the interlayer insulating film 3.

The edges of the top surface of the conducting film 5 contacting the barrier metal film 4 are chamfered to have an arc-shaped cross section such that the top surface sinks toward the portion of contact with the barrier metal film 4. With this, concentration of electric field in the conducting film 5 is mitigated when a voltage is applied to the conducting film 5 serving as a wiring. Accordingly, dielectric breakdown between adjacent wirings is properly suppressed.

The top surface of the second interlayer insulating film 3 is located below the upper end of the barrier metal film 4. This ensures that a leak path is substantially extended so that resistance to dielectric breakdown between adjacent wirings is further improved. A damaged layer DL is formed on top of the second interlayer insulating film 3. The term "damaged layer" refers to a state in which the composition of the second interlayer insulating film 3 is altered. An elevation of the barrier metal film 4 from the second interlayer insulating film 3 including the damaged layer DL is, for example, on the order of 1-100 nm, and an elevation of the barrier metal film 4 from the conducting film 5 is, for example, on the order of 1-50 nm Adhesion with an insulating film built on the damaged layer DL is improved due to the presence of the damaged layer DL.

A description will now be given of a method of fabricating the semiconductor apparatus according to the first embodiment by referring to FIGS. 2A-2D and FIG. 3A-3D. In these figures, those elements that are identical with the corresponding elements shown in FIG. 1 are designated by the same reference symbols and the description thereof is omitted.

Figure 2A:
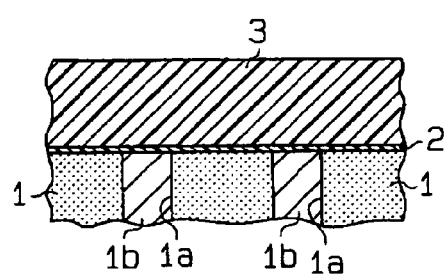
FIGS. 2A-2D are schematic sections showing a process of fabricating the semiconductor apparatus according to the first embodiment.

As shown in FIG. 2A, the first interlayer insulating film 2 is formed on the insulating film 1 by, for example, the plasma CVD process. The condition of plasma CVD is such that the processing pressure is 3.0 Torr (399 Pa), the high-frequency (RF) power is 470 W, the substrate temperature is 350° C., and the processing gas is trimethylsilane (TMS), He and $NH_3$.

On top of the second interlayer insulating film 2, the second interlayer insulating film 3 is formed by, for example, the plasma CVD process. The condition of plasma CVD is such that the processing pressure is 4.0 Torr (532 Pa), the high-frequency (RF) power is 600 W, the substrate temperature is 350° C., and the processing gas is trimethylsilane (TMS) and $O_2$.

After applying a resist on the top surface of the second interlayer insulating film 3, an opening of a desired pattern for forming a trench is formed by, for example, photolithography. Subsequently, anisotropic etching such as dry etching is performed using the resist as a mask so as to form the trench 3a as shown in FIG. 2B penetrating the first interlayer insulating film 2 and the second interlayer insulating film 3, and extending to the insulating film 1. The trench 3a is formed so as to reach the connecting hole wiring 1b. By using the first interlayer insulating film 2 as an etch stopper, precision in controlling the depth of the trench 3a is improved. The condition of etching is such that the processing pressure is 50 mTorr (6.65 pa), the high-frequency (RF) power is 1300 W, the substrate temperature is 20° C., and the processing gas is CF4 and CH2F and Ar and $N_2$.

Figure 2C:
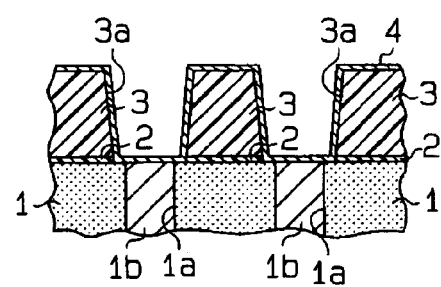
Figure 2B:
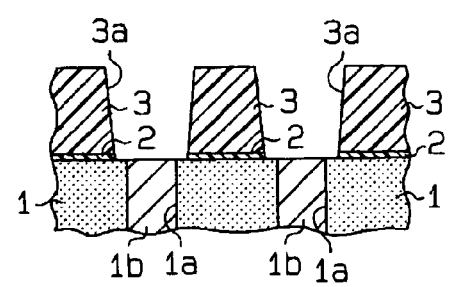
Figure 2D:
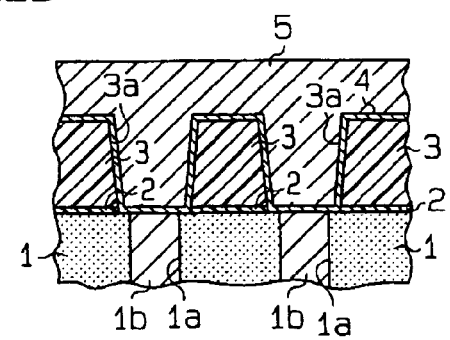

Subsequently, as shown in FIG. 2C, the barrier metal film 4 is formed on the surface of the substrate including the interior wall (lateral and bottom) of the trench 3a by, for example, sputtering. As shown in FIG. 2D, a seed layer (not shown) of copper is then formed on the surface of the barrier metal film 4 by, for example, sputtering. Subsequently, the conducting film 5 is formed by electroplating or electroless plating. The conducting film 5 is then subject to a thermal process (annealing) for, for example, 30 minutes in a nitrogen environment at 150° C. This is designed to embed the conducting film 5 in the substrate securely.

Figure 3A:
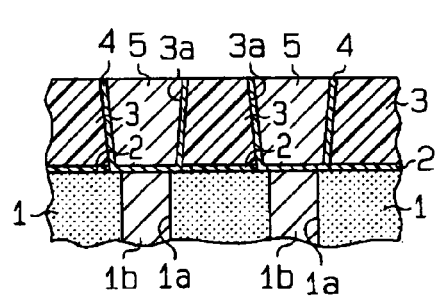
FIGS. 3A-3D are schematic sections showing a process of fabricating the semiconductor apparatus according to the first embodiment.
Figure 3C:
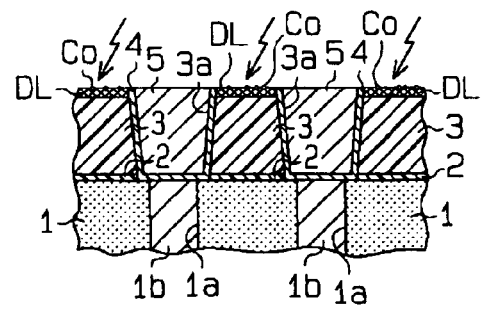
Figure 3B:
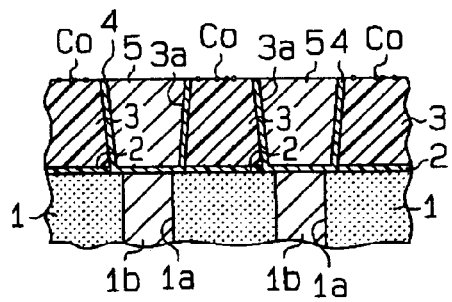

Subsequently, as shown in FIG. 3A, a polishing process such as CMP is performed so as to flatten the surface of substrate and expose the second interlayer insulating film 3. An alkali cleaning process using a water solution of ammonia is then performed. With this, a polishing solution (slurry) used in the polishing process is removed. Even after this alkali cleaning process, contaminant Co containing copper oxide, copper or tantalum remains on the surface of the second interlayer insulating film 3, as shown in FIG. 3B.

Subsequently, the flattened surface is subject to a plasma treatment in a non-nitriding environment (environment not containing nitrogen atoms). The condition of plasma treatment is such that the processing pressure is 6.0 Torr (798 Pa), the high-frequency (RF) power is 250 W, the substrate temperature is 350° C., the processing gas is argon (Ar), the flow rate of treating gas is 100 sccm ($cm^3$/minute), and the processing time is 90 seconds. As a result of the plasma treatment, the damaged layer DL is formed on top of the second interlayer insulating film 3, as shown in FIG. 3C. In this embodiment, SiOC is employed as a material of the second interlayer insulating film 3 so that methyl groups contained in SiOC are dissolved by the plasma treatment, resulting in the damaged layer DL being high in content of silicon oxide, which is soluble to hydrofluoric acid. In this process, the damaged layer DL (not shown) is also formed on the conducting layer 5.

Figure 3D:
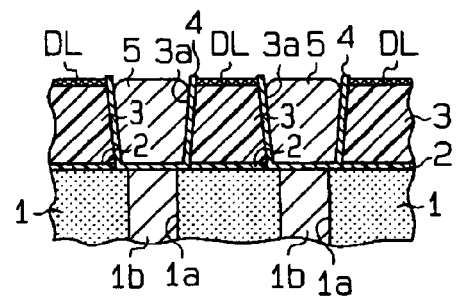

Subsequently, the damaged layer is subject to, for example, an organic acid cleaning process for 15 seconds at a room temperature, using, for example, oxalic acid. Then an acid cleaning process using, for example, hydrofluoric acid (water:hydrofluoric acid=100:1) is performed for 15 seconds at a room temperature. With this, a portion of the damaged layer DL is selectively removed by etching, as shown in FIG. 3D, and the contaminant Co that remains on the surface of the second interlayer insulating film 3 is removed. When the plasma process and cleaning are performed in the conditions mentioned above, 4 nm of the damaged layer DL is removed by etching. Depending on the conditions for plasma process and cleaning process, a depth on the order of 1 nm-100 nm is removed by etching. Since the damaged layer DL is high in content of silicon oxide soluble to hydrofluoric acid, selective etching described above is properly performed. In the portion of the conducting film 5 where the damaged layer DL is formed, bond strength between copper atoms is weakened so that resistance to etching is lowered. A point of note is that, since concentration of stress is facilitated in the corners of the top surface of the conducting film 5 where the film is in contact with the barrier metal film 4, resistance to etching is lowered in the corner portions. Therefore, etching is particularly facilitated in the corner portions. Consequently, the top surface of conducting film 5 has an arc-shaped cross section such that the top surface sinks toward the portion of contact with the barrier metal film 4. The top surface of the conducting film 5 contacting the barrier metal film 4 is located below the top surface of the second interlayer insulating film 3. Brush scrub cleaning is not performed in an acid cleaning process using hydrofluoric acid. This helps eliminate the likelihood of contaminant attached to a brush during a brush scrub cleaning being re-attached to the surface of the second interlayer insulating film 3. The cleanness of the surface of the second interlayer insulating film 3 is further improved.

Thus, according to the fabrication method described above, the contaminant Co collected on the second interlayer insulating film 3 is successfully removed by removing the damaged layer DL formed on top of the second interlayer insulating film 3. By removing the damaged layer formed on top of the conducting layer 5 by selective etching of the top surface of the conducting layer 5, the top surface of the conducting film 5 contacting the barrier metal film 4 is located below the top surface of the second interlayer insulating film 3. This results in a semiconductor apparatus in which dielectric breakdown between adjacent wirings is properly suppressed.

Figure 4:
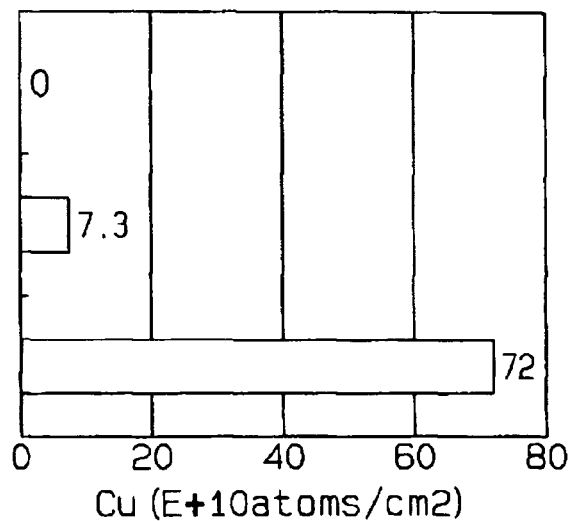
FIG. 4 is a graph showing the quantity of copper that remains on an interlayer insulating film of the semiconductor apparatus fabricated according to the method of the first embodiment in contrast with the quantity according to the related art.

FIG. 4 is a graph showing the quantity of copper that remains as contaminant on the second interlayer insulating film 3 when a range of cleaning methods are employed after forming the conducting film 5. Data C of FIG. 4 indicates the quantity of copper that remains when only an alkali cleaning process using a water solution of ammonia is performed. Data B indicates the quantity of remnant copper when an organic acid cleaning process and an acid cleaning process using hydrofluoric acid are performed in addition to the alkali cleaning process. Data A indicates the quantity of remnant copper when the cleaning method used in the first embodiment is performed. More specifically, data A indicates the quantity when a plasma treatment is performed in addition to the various cleaning processes of data B, i.e., performed prior to the organic acid cleaning process and the acid cleaning process using hydrofluoric acid.

The data of FIG. 4 show that the quantity of copper that remains on the second interlayer insulating film 3 is reduced to approximately $\frac{1}{10}$ (data B), by performing an organic acid cleaning process and an acid cleaning process using hydrofluoric acid in addition to the alkali cleaning process using a water solution of ammonia (data A). Even with such a cleaning method, removal of copper is not complete. A small quantity of copper and a substance used as a barrier metal, both of which are contaminants, remain on the second interlayer insulating film 3. By employing the cleaning method of the first embodiment in which a plasma treatment is performed in addition to the cleaning method associated with data B, copper attached on the second interlayer insulating film 3 is nearly completely removed, as indicated by data A.

A description will now be given of the TDDB characteristic of the semiconductor apparatus according to the first embodiment, by referring to FIG. 5A-8.

Figure 5A:
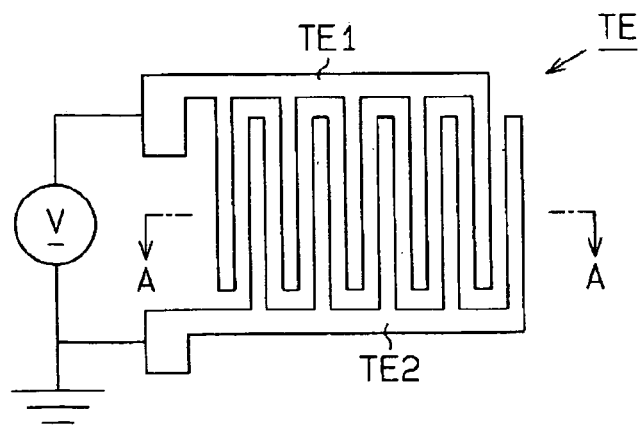
FIG. 5A is a schematic plan view of a structure of sample used in measurement of TDDB characteristic.
Figure 5B:
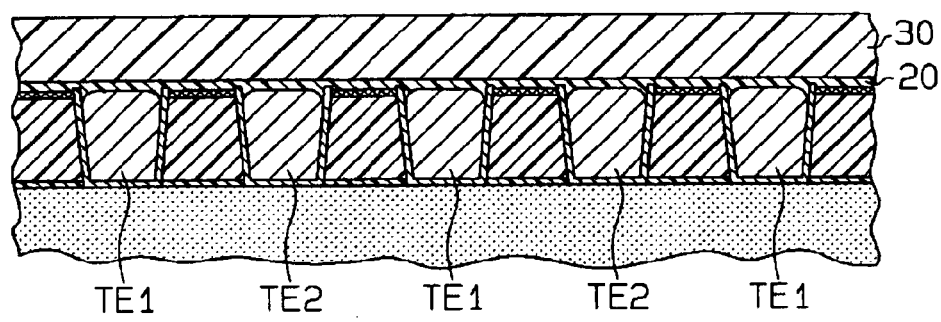
FIG. 5B is an A-A section of FIG. 5A.
Figure 6:
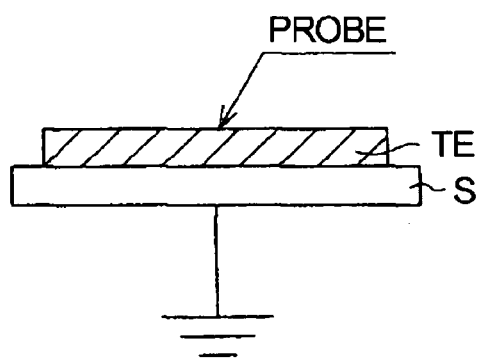
FIG. 6 is a schematic side view showing how the measurement is done.

FIGS. 5A, 5B and 6 show how the TDDB characteristic is measured. FIG. 5A is a schematic plan view of a structure of sample used in the measurement. FIG. 5B is an A-A section of FIG. 5A. FIG. 6 is a schematic side view showing how the measurement is done.

As shown in FIG. 5A, a sample TE used in the measurement is composed of comb-shaped wirings TE1 and TE2 disposed opposite to each other. A predetermined voltage is applied between the comb-shaped wiring TE1 and the TE2 constituting the sample TE. More specifically, the wirings TE1 and TE2 are constructed in the same manner as the semiconductor (conductive film 5) shown in FIG. 1. The sample TE is formed by successively building the insulating film 20 of SiCN or the like and the insulating film 30 of SiOC or the like on the wirings TE1 and TE2. The wirings TE1 and TE2 are formed with a thickness of 3000 Å, a width of 0.5 μm, a length of parallel orientation of 3 cm, and a wiring interval of 0.18 μm.

As shown in FIG. 6, a total of 28 samples TE in a given wafer are mounted on an electrically grounded, heated stage. While the sample TE is being heated, a voltage is applied on a total of 28 measurement points (28 samples TE) using a probe. A current level is detected so as to determine whether dielectric breakdown occurs. The voltage applied between the wirings TE1 and TE2 in the measurement is 1V-100V, and the sample temperature is 125° C.

A description will now be given of the TDDB characteristic of the semiconductor apparatus according to the first embodiment subject to the measurement as described above, by referring to FIGS. 7 and 8. Data taken at the measurement points are grouped according to the integral of probability density function (function indicated by a normal distribution curve), i.e. according to the cumulative frequency (indicated by %). For example, the median of the total of 28 measurement points is represented as the cumulative frequency 50%. The data with the second shortest TDDB lifetime among the entire data is represented by the cumulative frequency 6%.

Figure 7:
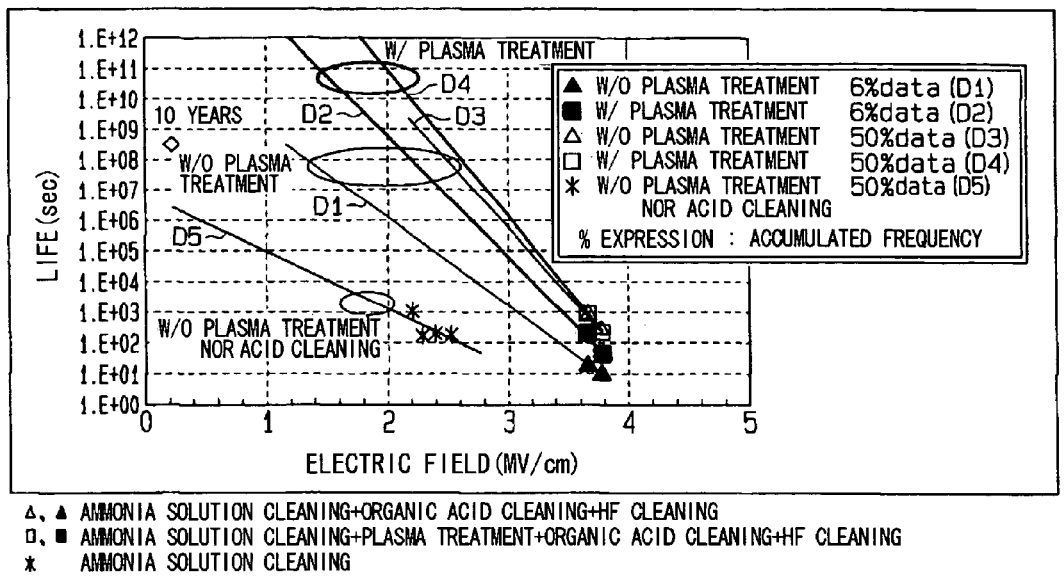
FIG. 7 is a graph showing the TDDB characteristic of the semiconductor apparatus according to the first embodiment in contrast with that of the related art.

FIG. 7 is a graph showing a relationship between a voltage (electric field) applied between the wirings TE1 and TE2 of a sample fabricated using a range of cleaning methods, and a TDDB lifetime. Data D2 and D4 of FIG. 7 are taken for a sample fabricated using the same cleaning method as the sample associated with data A shown in FIG. 4. Data D1 and D3 are taken for a sample fabricated using the same cleaning method as the sample associated with data B shown in FIG. 4. Data D5 is taken for a sample fabricated using the same cleaning method as the sample associated with data C shown in FIG. 4. The graphs of data D1 and D2 show a relationship between the electric field and the TDDB lifetime for data with the cumulative frequency 6%. The graphs of data D3-D5 show a relationship between the electric field and the TDDB lifetime for data with the cumulative frequency 50%.

The graphs show that the samples (D2 and D4) fabricated using the cleaning method in which an acid cleaning process is preceded by a plasma treatment have longer TDDB lifetime than the samples (D1 and D3) fabricated using the cleaning method in which a plasma treatment is not performed. Improvement in the TDDB lifetime by performing a plasma treatment is especially noticeable for the data D1 and D2 of the cumulative frequency 6%.

Figure 8:
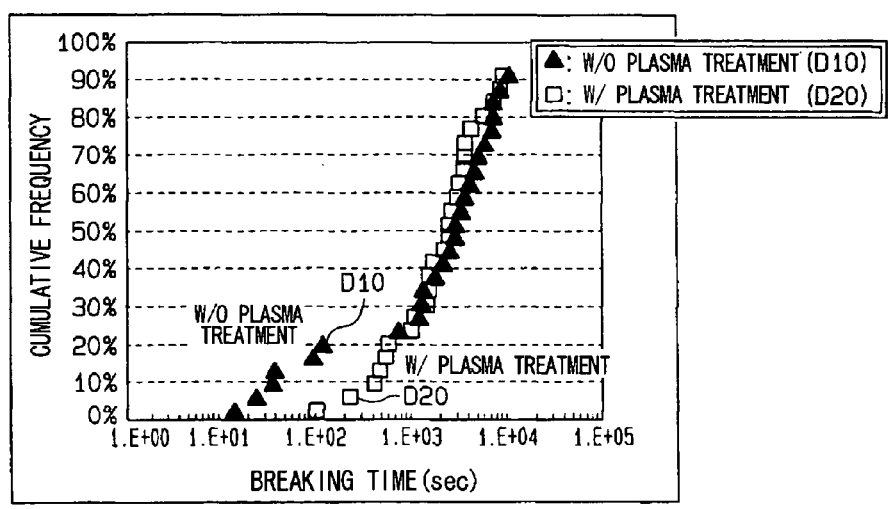
FIG. 8 is a graph showing the TDDB characteristic of the semiconductor apparatus according to the first embodiment in contrast with that of the related art.

FIG. 8 is a graph showing a relationship between an cumulative frequency and a breaking time (time that elapses before dielectric breakdown occurs) for samples fabricated using a range of cleaning methods. Data D10 of FIG. 8 is taken for a sample fabricated using the same cleaning method as the sample associated with data B shown in FIG. 4. Data D20 is taken for a sample fabricated using the same cleaning method as the sample associated with data A shown in FIG. 4.

The graph shows that, for data D20, plots are located substantially on the same line. Dispersion in breaking time is limited for the entirety of measurement points. In contrast, for plots of data D10 representing the cumulative frequency of lower than 20%, there is an sharp decrease in breaking time. This means that a large number of points characterized by a considerably short breaking time occur in the total of 28 measurement points (28 points). When there are a large number of locations characterized by a short breaking time (low resistance to dielectric breakdown) exist in a given sample, a drop in the yield may be invited. As described above, according to the method of fabricating a semiconductor apparatus of the first embodiment, dispersion in breaking time, i.e. in resistance to dielectric breakdown is suppressed. With this, the yield is improved.

According to the fabrication method described above, the damaged layer DL is formed in a non-nitriding environment so that the damaged layer not containing nitrogen atoms is formed on top of the second interlayer insulating film 3 and the conducting film 5. Consequently, even when a resist is deposited on the damaged layer so as to form a wiring pattern and the resist is subject to a heating (pre-baking) process before exposure, the likelihood of nitrogen atoms being introduced into the resist is reduced. Accordingly, resist poisoning discussed above is suppressed.

As described above, according to the semiconductor apparatus of the first embodiment, the following advantageous effects are provided.

(1) The top surface of the conducting film 5, the embedded wiring, contacting the barrier metal film 4 is located below the top surface of the barrier metal film 4. As obvious from the measurement results of FIGS. 7 and 8, dielectric breakdown between adjacent wirings is properly suppressed by employing this structure.

(2) The top surface of the conducting film 5 contacting the barrier metal film 4 is located below the top surface of the second interlayer insulating film 3. By employing this structure, even when diffusion from the conducting film 5 occurs across the barrier metal film 4, formation of a leak path caused by diffusion from the conducting film 5 is suppressed or prevented.

(3) The top surface of the second interlayer insulating film 3 contacting the barrier metal film 4 is located below the upper end of the barrier metal film 4. By employing this structure, dielectric breakdown between adjacent wirings is properly suppressed.

(4) The conducting film 5 is configured to have an arc-shaped cross section such that the top surface sinks toward the portion of contact with the barrier metal film 4. By employing this structure, resistance to dielectric breakdown between adjacent wirings is further enhanced.

(5) The damaged layer DL is formed on top of the second interlayer insulating film 3. With this structure, as obvious from the graph of FIG. 4, the contaminant Co collected on the damaged layer DL is properly removed by etching the damaged layer DL. As a result, dielectric breakdown between adjacent wirings is properly suppressed.

(6) The semiconductor apparatus is fabricated such that the first interlayer insulating film 2 and the second interlayer insulating film 3 are formed on the insulating film 1. The trench 3a extending to the insulating film 1 is formed on the interlayer insulating films 2 and 3. Subsequently, the barrier metal film 4 is formed on the interior wall (lateral and bottom) of the trench 3a. After the conducting film 5 is built on the barrier metal film 4 so as to be embedded therein, the conducting film 5 is removed by CMP so as to expose the second interlayer insulating film 3. In a non-nitriding environment, the damaged layer DL is formed on top of the second interlayer insulating film 3 thus exposed and on top of the conducting film 5. Thereafter, a portion of the damaged layer DL is removed by etching. By employing this fabrication method, even when a resist is deposited on the damaged layer DL so as to form a wiring pattern and the resist is subject to a heating (pre-baking) process before exposure, resist poisoning is properly suppressed. By removing the damaged layer DL formed on the second interlayer insulating film 3 and the conducting film 5, the contaminant Co collected on the second interlayer insulating film 3 is properly removed.

(7) Formation of the damaged layer DL is performed by a plasma treatment using argon (Ar). By using this fabrication method, the damaged layer is properly formed in a non-nitriding environment.

(8) SiOC is employed as a material to form the second interlayer insulating film 3, and hydrofluoric acid (HF) is used to etch the damaged layer DL. With this, selective etching of the damaged layer DL formed in the second interlayer insulating film 3 is properly performed.

Second Embodiment

Figure 9:
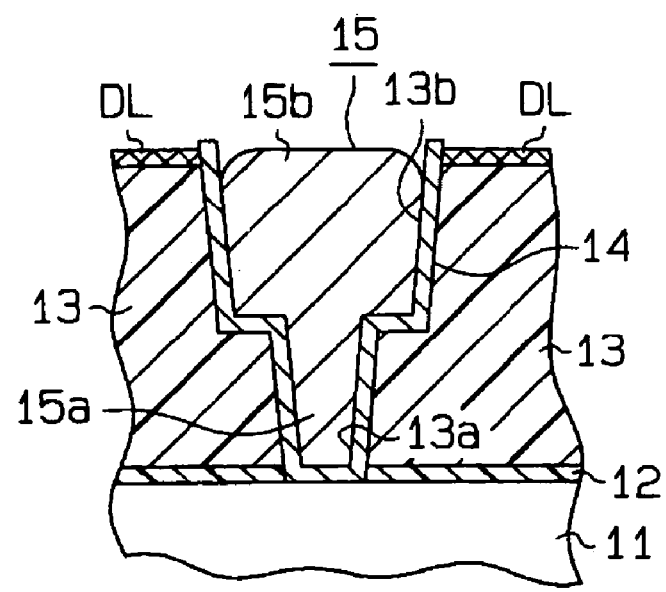
FIG. 9 is a schematic section showing a semiconductor apparatus according to a second embodiment of the present invention.

FIG. 9 shows a semiconductor according to a second embodiment of the present invention.

In a similar configuration as the semiconductor apparatus shown in FIG. 1, the semiconductor apparatus according to the second embodiment is constructed such that resist poisoning is suppressed and dielectric breakdown between adjacent wirings is suppressed so that the TDDB lifetime is improved. A difference is that the semiconductor apparatus according to the second embodiment has a multilayer wiring structure by building a wiring layer on a substrate in which embedded wiring formed of copper or the like is formed.

A description will now be given of the structure of the semiconductor apparatus according to the second embodiment, by referring to FIG. 9. FIG. 9 shows a schematic section of the semiconductor apparatus according to the second embodiment.

As shown in FIG. 9, the semiconductor apparatus comprises a stack of: a substrate 11 in which an embedded wiring formed of copper or the like is formed, as shown in FIG. 1; a third interlayer insulating film 12 formed of SiCN or the like capable of effectively preventing diffusion of copper; and a fourth interlayer insulating film 13 formed of a low-k material such as SiOC.

In the third interlayer insulating film 12 and the fourth interlayer insulating film 13 are formed a connecting hole 13a reaching the conducting film 5 formed on the substrate 11, and a groove 13b having a section width larger than that of the connecting hole and located above the connecting hole. On the interior wall (lateral and bottom) of the trench constituted by the connecting hole 13a and the groove 13b is formed a barrier metal film 14 formed of, for example, tantalum nitride (TaN). A conducting film 15 of copper is built on the barrier metal film 14 by being embedded in the connecting hole 13a and the groove 13b. The conductive film 15 comprises a portion 15b corresponding to wiring, and a portion 15a corresponding to an interlayer connection plug for connecting the portion 15b and the lower-layer wiring (conducting film 5). The barrier metal film 14 provides the function of improving adhesion between the conducting film 15 and the interlayer insulating film or suppressing diffusion from the conducting film 15. The third interlayer insulating film 12 is formed with a thickness of, for example, 500 Å-1000 Å, the fourth interlayer insulating film 13 is formed with a thickness of 2500 Å-10000 Å, and the barrier metal film 14 is formed with a thickness of 250 Å. The portion 15b of the conducting film 5 is formed with a thickness of, for example, 4000 Å and a width of 0.18 µm. The portion 15a is formed with a thickness of, for example, 3000 Å and a width of 0.16 µm.

The top surface of the conducting film 15 contacting the barrier metal film 14 is located below the top surface of the third interlayer insulating film 13. With this, formation of a leak path caused by diffusion from the conducting film 15 is suppressed or prevented. As mentioned above, this translates into suppression of dielectric breakdown between adjacent wirings.

The edges of the top surface of the conducting film 15 contacting the barrier metal film 14 are chamfered to have an arc-shaped cross section such that the top surface sinks toward the portion of contact with the barrier metal film 14. The top surface of the fourth interlayer insulating film 13 is located below the upper end of the barrier metal film 14. As mentioned above, by employing this structure, resistance to dielectric breakdown between adjacent wirings is further enhanced.

A damaged layer DL is formed on top of the fourth interlayer insulating film 13. The term "damaged layer" refers to a state in which the composition of the fourth interlayer insulating film 13 is altered. An elevation of the barrier metal film 14 from the fourth interlayer insulating film 13 including the damaged layer DL is, for example, on the order of 1-100 nm, and an elevation of the barrier metal film 14 from the conducting film 15 is, for example, on the order of 1-50 nm. Adhesion with an insulating film built on the damaged layer DL is improved due to the presence of the damaged layer DL.

A description will now be given of a method of fabricating the semiconductor apparatus according to the second embodiment by referring to FIGS. 10A-10D and FIGS. 11A-11F. In these figures, those elements that are identical with the corresponding elements shown in FIG. 9 are designated by the same reference symbols and the description thereof is omitted. The semiconductor apparatus shown in FIG. 1 is used as the substrate 11 (FIG. 9).

Figure 10A:
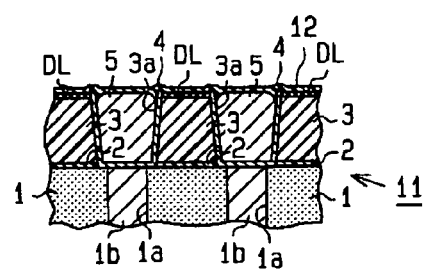
FIGS. 10A-10D are schematic sections showing a process of fabricating the semiconductor apparatus according to the second embodiment.

As shown in FIG. 10A, the third interlayer insulating film 12 is formed on the substrate 11 by, for example, the plasma CVD process. The condition of formation of the third interlayer insulating film 12 is the same as the condition of formation of the first interlay insulating film 2 shown in the first embodiment.

Figure 10B:
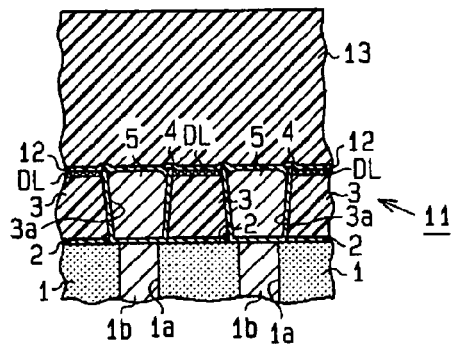

On top of the third interlayer insulating film 12, the fourth interlayer insulating film 13 is formed by, for example, the plasma CVD process, as shown in FIG. 10B. The condition of formation of the fourth interlayer insulating film 13 is the same as the condition of formation of the second interlay insulating film 3 shown in the first embodiment.

Figure 10C:
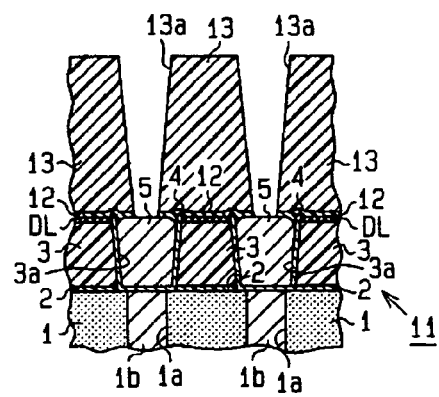
Figure 10D:
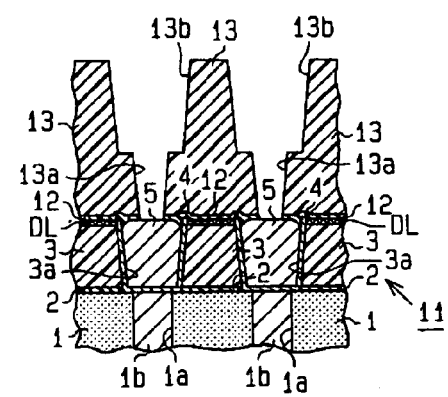

After applying a resist on the top surface of the fourth interlayer insulating film 13, an opening of a desired pattern for forming a connecting hole is formed by, for example, photolithography. Subsequently, anisotropic etching such as dry etching is performed using the resist as a mask so as to form the connecting hole 13a as shown in FIG. 10C penetrating the third interlayer insulating film 12 and the fourth interlayer insulating film 13 and extending to the substrate 11. The connecting hole 13a is formed so as to reach the conducting film 5 formed in the substrate 11. By using the third interlayer insulating film 12 as an etch stopper, precision in controlling the depth of the connecting hole 3a is improved. Subsequently, anisotropic etching such as dry etching is performed the resist as a mask so as to form the groove 13b as shown in FIG. 10D above connecting hole 13a. The etching condition for the connecting hole 13a and the groove 13b is the same as the etching condition for the trench 3a shown in the first embodiment.

Figure 11A:
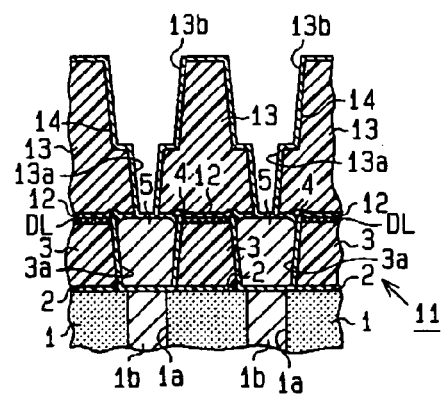
FIGS. 11A-11F are schematic sections showing a process of fabricating the semiconductor apparatus according to the second embodiment.
Figure 11D:
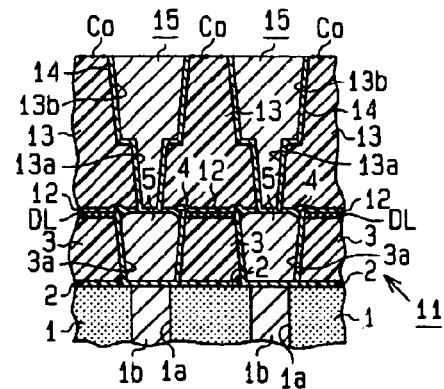
Figure 11B:
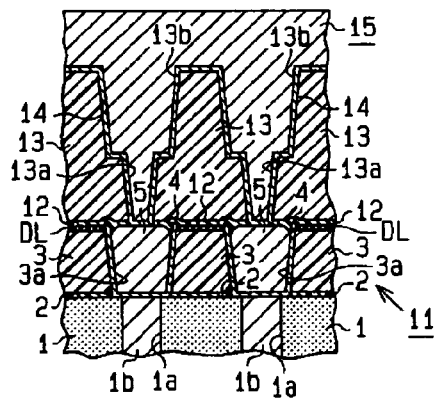
Figure 11E:
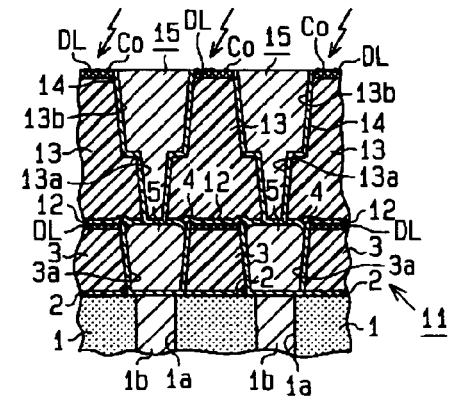
Figure 11C:
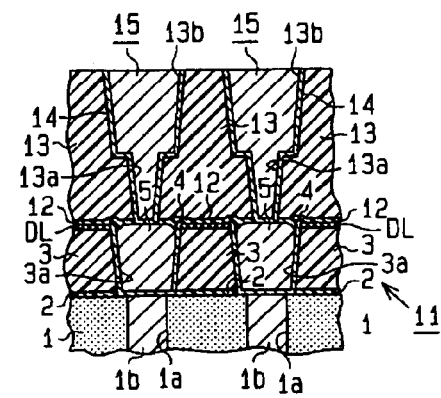

Subsequently, as shown in FIG. 11A, the barrier metal film 14 is formed on the surface of the substrate including the interior wall (lateral and bottom) of the trench constituted by the connecting hole 13a and the groove 13b by, for example, sputtering. As shown in FIG. 11B, a seed layer (not shown) of copper or the like is then formed on the, surface of the barrier metal film 14 by, for example, sputtering. Subsequently, the conducting film 15 is formed by electroplating or electroless plating. The conducting film 15 is subject to a thermal process (annealing) for, for example, 30 minutes in a nitrogen environment at 150° C. This is designed to embed the conducting film 15 in the substrate securely.

Subsequently, as shown in FIG. 1C, a polishing process such as CMP is performed so as to flatten the surface of substrate and expose the fourth interlayer insulating film 13. An alkali cleaning process using a water solution of ammonia is then performed. With this, a polishing solution (slurry) used in the polishing process is removed. Even after this alkali cleaning process, contaminant Co containing copper oxide, copper or tantalum remains on the surface of the fourth interlayer insulating film 13, as shown in FIG. 1D.

Subsequently, the flattened surface is subject to a plasma treatment in a non-nitriding environment (environment not containing nitrogen atoms). The condition for plasma treatment is the same as the condition for plasma treatment shown in the first embodiment. As a result of the plasma treatment, the damaged layer DL is formed on top of the fourth interlayer insulating film 13, as shown in FIG. 1E. In this embodiment, SiOC is employed as a material of the fourth interlayer insulating film 13 so that methyl groups contained in SiOC are dissolved by the plasma treatment, resulting in the damaged layer DL being high in content of silicon oxide soluble to hydrofluoric acid. In this process, the damaged layer DL (not shown) is also formed on the conducting layer 15.

Figure 11F:
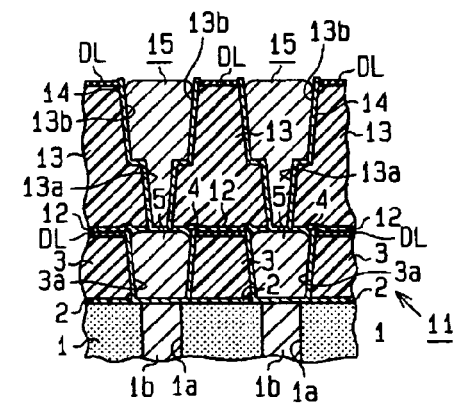

Subsequently, the damaged layer is subject to, for example, an organic acid cleaning process for 15 seconds at a room temperature, using, for example, oxalic acid. Then an acid cleaning process using, for example, hydrofluoric acid (water:hydrofluoric acid=100:1) is performed for 15 seconds at a room temperature. With this, a portion of the damaged layer DL is selectively removed by etching, as shown in FIG. 11F, and the contaminant Co that remains on the surface of the fourth interlayer insulating film 13 is removed. Accordingly, the top surface of conducting film 15 has an arc-shaped cross section such that the top surface sinks toward the portion of contact with the barrier metal film 14. The top surface of the conducting film 15 contacting the barrier metal film 14 is located below the top surface of the fourth interlayer insulating film 13. Brush scrub cleaning is not performed in an acid cleaning process using hydrofluoric acid. This helps eliminate the likelihood of contaminant attached to a brush during a brush scrub cleaning being re-attached to the surface of the fourth interlayer insulating film 13. The cleanness of the surface of the fourth interlayer insulating film 13 is further improved.

Thus, according to the fabrication method described above, the contaminant Co collected on the fourth interlayer insulating film 13 is removed by removing the damaged layer DL formed on top of the fourth interlayer insulating film 13. By selective etching of the top surface of the conducting layer 15, the top surface of the conducting film 15 contacting the barrier metal film 14 is located below the top surface of the fourth interlayer insulating film 13. This results in a semiconductor apparatus in which dielectric breakdown between adjacent wirings is properly suppressed.

By employing this fabrication method, even when a resist is deposited on the substrate so as to form a wiring pattern and the resist is subject to a heating (pre-baking) process before exposure, resist poisoning is properly suppressed.

Figure 12:
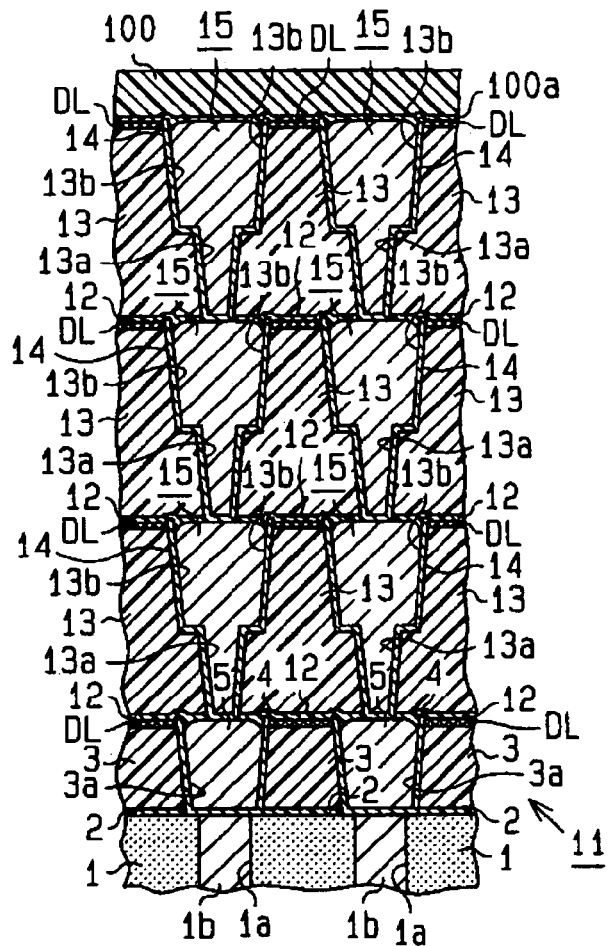
FIG. 12 is a schematic section of multilayer wiring using a stack of the semiconductor apparatus according to the second embodiment.

By building a stack of the semiconductor apparatus having the above structure, and further building thereon a cap film 100a formed of SiCN or the like and a protection film 100 formed of tetraethyl ortho silicate (TEOS) or the like, a semiconductor apparatus having a multilayer wiring structure as shown in FIG. 12 is formed.

As described above, the semiconductor apparatus according to the second embodiment provides the same or similar effects as the effects (1)-(8) of the first embodiment.

Other Embodiments

The embodiments described above may also practiced in the following embodiments.

In the second embodiment, the connecting hole 13a is formed before the groove 13 is formed. Alternatively, the groove 13 may be formed before the connecting hole 13a is formed.

In the embodiments described above, an interlayer insulating film formed between adjacent wirings (conducting films) is of a two-layer structure. For example, the first interlayer insulating film 2 and the second interlayer insulating film 3 constitute a two-layer structure. The third interlayer insulating film 12 and the fourth interlayer insulating film 13 constitute a two-layer structure. An interlayer insulating film may be of a single-layer structure or a structure of three or more layers, instead of a two-layer structure.

In the embodiments described above, SiOC is used as a material to form the second interlayer insulating film 3 and the fourth interlayer insulating film 13. Alternatively, silicon oxide containing methyl groups such as methyl silsesquioxane (MSQ) may also be used as a material to form these interlayer insulating films. With this, the same or similar effect as the effect of (8) is available. Interlayer insulating films may be formed of a low-k material such as SiOF, characterized by a lower dielectric constant than silicon oxide (dielectric constant≈4), or of silicon oxide, as the case may be.

Examples of Low-k materials other than SiOC are SiOF (k=3.5-3.8) formed by the CVD method, benzocyclobutene (BCB) (dielectric constant k=2.5-2.7), hydrogen silsesquioxane (HSQ) (dielectric constant k=2.3-3.1) formed by the spin-on dielectrics (SOD) method, methyl silsesquioxane (MSQ) (dielectric constant k=1.9-2.5), hydride methyl silsesquioxane (HMSQ) (dielectric constant k≦2.2-2.5), polyimide polymer (dielectric constant k=2.6-2.8), allylene ether polymer (dielectric constant k=2.2-2.8), cyclobutene polymer (for example, divinyl siloxane benzocyclobutene (VDS-BCB) (dieletcric constant k=2.2-2.6)), and perfluorinated cyclobutene (PFCB) (dielectric constant k=2.2).

Figure 14:
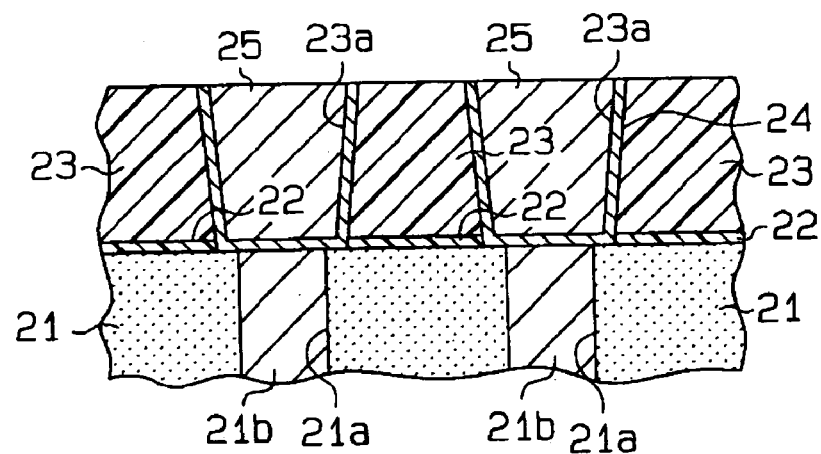
FIG. 14 is a schematic section of a semiconductor apparatus according to the related art.
Figure 15:
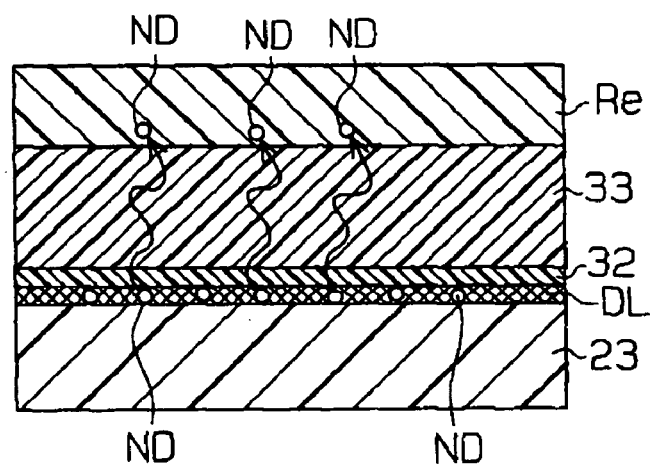
FIG. 15 is a schematic section showing a process of fabricating the semiconductor apparatus according to the related art.

A simulation for determining how the TDDB lifetime varies with the dielectric constant k of the material used in the second interlayer insulating film 3 was conducted in the semiconductor apparatus of the cross sectional structure of the first embodiment and the semiconductor apparatus of the related-art structure shown in FIG. 14. The wirings 5 and 25 have a thickness of 3000 Å, a width of 0.5 µm, a length of parallel orientation of 3 cm, and a wiring interval of 0.18 µm. The voltage applied between the adjacent wirings is 3.6 V, and the sample temperature is 125° C.

Table 1 shows the TDDB lifetime of the semiconductor apparatus of the cross sectional structure of the first embodiment and the semiconductor apparatus of the related-art structure. Referring to Table 1, the unit of TDDB lifetime is log(sec). 8.5 log(sec) corresponds to 10 years, a measure of acceptable length in a reliability test.

TABLE 1

| | TDDB LIFETIME | |
|---|---|---|
| DIELECTRIC CONSTANT k | STRUCTURE OF 1ST EMBODIMENT (log(sec)) | RELATED-ART STRUCTURE (log(sec)) |
| 4.2 | 32.5 | 27.0 |
| 4.1 | 30.9 | 25.4 |
| 4.0 | 29.3 | 23.8 |
| 3.9 | 27.8 | 22.3 |
| 3.8 | 26.2 | 20.7 |
| 3.7 | 24.6 | 19.1 |
| 3.6 | 23.0 | 17.5 |
| 3.5 | 21.5 | 16.0 |
| 3.4 | 19.9 | 14.4 |
| 3.3 | 18.3 | 12.8 |
| 3.2 | 16.7 | 11.2 |
| 3.1 | 15.2 | 9.7 |
| 3.0 | 13.6 | 8.1 |
| 2.9 | 12.0 | 6.5 |
| 2.8 | 10.4 | 4.9 |
| 2.7 | 8.8 | 3.3 |
| 2.6 | 7.3 | 1.8 |
| 2.5 | 5.7 | 0.2 |
| 2.4 | 4.1 | −1.4 |
| 2.3 | 2.5 | −3.0 |

While the TDDB lifetime for a range of dielectric constant k=2.7-3.0 is shorter than 10 years in the related-art structure, the TDDB lifetime is extended beyond 10 years owing to the improvement in the structure according to the first embodiment. Examples of materials with a dielectric constant k of 2.7-3.0 include BCB, HSQ, polyimide polymer and allylene ether polymer.

In the embodiments described above, SiCN is used as a material to form the first interlayer insulating film 2 and the third interlayer insulating film 12. However, any appropriate material may be used to form these interlayer insulating films. For example, SiN or SiC may be optionally employed. Also, any appropriate material may be used to form the insulating film 1 and the substrate 11. The barrier metal film 4 and the barrier metal film 14 may also be of any appropriate material. For example, TiN or Ta may be employed as the case may be. Further, the conducting film 5 and the conducting film 15 may be of any appropriate conducting material. For example, a copper alloy or aluminum may be employed as the case may be.

Figure 13A:
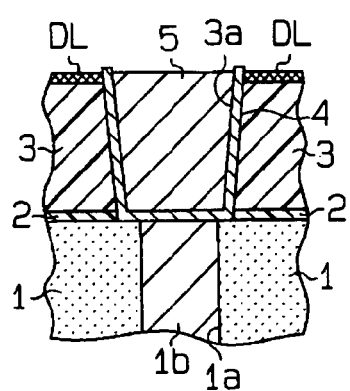
FIGS. 13A and 13B are schematic sections of the semiconductor apparatus according to variations of the embodiments.
Figure 13B:
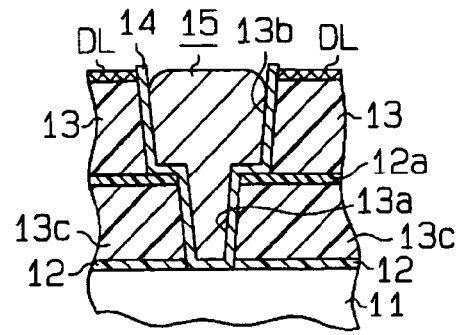

In the embodiments described above, the damaged layer DL is formed on top of the second interlayer insulating film 3 or the fourth interlayer insulating film 13. These interlayer insulating films are constructed such that the top surface thereof contacting the barrier metal film is located below the upper end of the barrier metal film. The conducting films 5 and 15 are constructed such that the top surface thereof contacting the barrier metal film is located below the top surface of the second interlayer insulating film 3 and the fourth interlayer insulating film 14, respectively. The top surface of the conducting films is configured to have an arc-shaped cross section that sinks toward the portion of contact with the barrier metal film. However, the films may not be constructed as described above. The requirement is that at least the top surface of the conducting films 5 and 15 contacting the barrier metal film be located below the upper end of the barrier metal film. The structure illustrated in FIGS. 13A and 13B can be employed as the case may be. FIG. 13A is a section corresponding to FIG. 1. FIG. 13B is a section corresponding to FIG. 9. The semiconductor apparatus shown in FIG. 13A is constructed such that the entirety of the top surface of the conducting film 5 is located below the upper end of the barrier metal film 4. The semiconductor apparatus shown in FIG. 13B is constructed such that an interlayer insulating film 12a functioning as an etch stopper (intermediate etch stopper) in the process of forming the groove 13b is formed below the groove 13b. The semiconductor apparatus is fabricated such that an interlayer insulating film 13c formed of SiOC or the like, the interlayer insulating film 12a formed of SiCN or the like, and the fourth interlayer insulting film 13 are successively built on the third interlayer insulating film 12 before the connecting hole 13a and the groove 13b are formed. An etch stopper of a two-layer structure (double etch stoppers) can be employed as the case may be.

In the embodiments described above, the conducting film 5 and the conducting film 15 are formed by plating. Alternatively, any appropriate method for forming the films may be used. For example, the films may be formed by sputtering or the CVD method. The thermal process (annealing) after the film formation may be performed in vacuum.

In the embodiments described above, the damaged layer may be etched by hydrofluoric acid. Alternatively, any appropriate etching method may be employed. For example, dry etching using a fluoric gas may be performed. The entirety, instead of a portion, of the damaged layer may be removed by etching.

In the embodiments described above, the damaged layer is formed by a plasma treatment using argon (Ar). Any appropriate method of forming the damaged layer may be used as long as the formation is done in a non-nitriding environment. A plasma treatment using noble gas other than argon (Ar), or irradiation of electron beam or ultraviolet beam may be performed.

In the embodiments described above, the barrier metal film and the conducting film are provided in the trench formed in the interlayer insulating film. However, structures other than that in which a trench is formed in an interlayer insulating film may also be used. The present invention is applicable to any semiconductor apparatus provided with an insulating film having a trench, a barrier metal film formed on the interior wall of the trench, and a conducting film embedded in the trench interior to the barrier metal film.

What is claimed is:

1. A semiconductor fabrication method comprising the steps of:
    forming an insulating film;
    forming a trench in said insulating film;
    forming a barrier metal film in the interior wall of said trench;
    forming a conducting film on said barrier metal film so as to be embedded in said trench;
    removing said conducting film by polishing so as to expose said insulating film;
    forming a damaged layer on top of said exposed insulating film and said conducting film in a non-nitriding environment; and
    removing at least a portion of said damaged layer by etching.

2. The semiconductor fabrication method according to claim 1, wherein a low-k material with a dielectric constant lower than that of silicon oxide is used to form said insulating film.

3. The semiconductor fabrication method according to claim 2, wherein the low-k material is selected from a group comprising: silicon oxide containing methyl groups, benzocyclobutene (BCB), fluorinated silicon dioxide (SiOF), hydrogen silsesquioxane (HSQ), methyl silsesquioxane (MSQ), hydride methyl silsesquioxane (HMSQ), polyimide polymer, allylene ether polymer, cyclobutene polymer, and perfluorinated cyclobutene (PFCB).

4. A semiconductor apparatus comprising:
an insulating film provided with a trench;
a barrier metal film formed on the interior wall of said trench; and
a conducting film formed so as to be embedded in said trench interior via said barrier metal film, wherein
at least the top surface of said conducting film contacting said barrier metal film is located below the upper end of said barrier metal film, and is configured to have an arc-shaped cross section that sinks toward a point of contact with said barrier metal film.

5. The semiconductor apparatus according to claim 1, wherein at least the top surface of said conducting film contacting said barrier metal film is located below the top surface of said insulating film.

6. The semiconductor apparatus according to claim 1, wherein at least the top surface of said conducting film contacting said barrier metal film is located below the upper end of said barrier metal film.

7. The semiconductor apparatus according to claim 1, wherein composition of a top portion of said insulating film is altered.

8. The semiconductor apparatus according to claim 1, wherein said insulating film is formed of a low-k material with a dielectric constant lower than that of silicon oxide.

9. The semiconductor apparatus according to claim 8, wherein the low-k material is selected from a group comprising: silicon oxide containing methyl groups, benzocyclobutene (BCB), fluorinated silicon dioxide (SiOF), hydrogen silsesquioxane (HSQ), methyl silsesquioxane (MSQ), hydride methyl silsesquioxane (HMSQ), polyimide polymer, allylene ether polymer, cyclobutene polymer, and perfluorinated cyclobutene (PFCB).

10. The semiconductor apparatus according to claim 8, wherein the dielectric constant of the low-k material is 2.7-3.

* * * * *